(12) United States Patent
Otten et al.

(10) Patent No.: US 8,492,715 B2
(45) Date of Patent: Jul. 23, 2013

(54) METHOD OF PROTECTING A RADIATION DETECTOR IN A CHARGED PARTICLE INSTRUMENT

(75) Inventors: Maximus Theodorus Otten, Best (NL); Gerrit Cornelis Van Hoften, Veldhoven (NL); Joeri Lof, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/441,344

(22) Filed: Apr. 6, 2012

(65) Prior Publication Data

US 2012/0256085 A1 Oct. 11, 2012

Related U.S. Application Data

(60) Provisional application No. 61/472,976, filed on Apr. 7, 2011.

(30) Foreign Application Priority Data

Apr. 7, 2011 (EP) ..................................... 11161427

(51) Int. Cl.
*G01N 23/00* (2006.01)
*G21K 7/00* (2006.01)

(52) U.S. Cl.
USPC ............ 250/307; 250/310; 250/311; 250/397

(58) Field of Classification Search
USPC .................................. 250/307, 310, 311, 397
See application file for complete search history.

(56) References Cited

U.S. PATENT DOCUMENTS

| | | | |
|---|---|---|---|
| 7,262,411 B2 * | 8/2007 | Nguyen-Huu et al. ....... | 250/310 |
| 7,845,245 B2 | 12/2010 | Hayles et al. | |
| 7,851,769 B2 | 12/2010 | Schmid et al. | |
| 8,334,512 B2 | 12/2012 | Luecken et al. | |
| 8,338,782 B2 | 12/2012 | Leucken et al. | |
| 2003/0151002 A1 | 8/2003 | Ito et al. | |
| 2006/0169901 A1 | 8/2006 | Nguyen-Huu et al. | |
| 2010/0025579 A1 * | 2/2010 | Bilhorn ........................ | 250/310 |
| 2011/0266439 A1 * | 11/2011 | Luecken et al. .............. | 250/307 |
| 2012/0032078 A1 | 2/2012 | Stekelenburg et al. | |

FOREIGN PATENT DOCUMENTS

EP 2381236 10/2011

OTHER PUBLICATIONS

Faruqi, A.R. et al., 'Electronic Detectors for Electron Microscopy,' Current Opinion in Structural Biology, Oct. 29, 2007, pp. 549-555, vol. 17, No. 5.

Battaglia, M. et al., "Characterisation of a CMOS Active Pixel Sensor for use in the TEAM Microscope", Nuclear Instruments and Methods in Physics Research Section A, vol. 622, Issue 3, p. 669-677.

* cited by examiner

*Primary Examiner* — Nikita Wells
*Assistant Examiner* — Meenakshi Sahu
(74) *Attorney, Agent, or Firm* — Scheinberg & Associates, PC; Michael O. Scheinberg

(57) ABSTRACT

The invention relates to a Method of protecting a direct electron detector (151) in a TEM. The invention involves predicting the current density on the detector before setting new beam parameters, such as changes to the excitation of condenser lenses (104), projector lenses (106) and/or beam energy. The prediction is made using an optical model or a Look-Up-Table. When the predicted exposure of the detector is less than a predetermined value, the desired changes are made, otherwise a warning message is generated and changes to the settings are postponed.

17 Claims, 2 Drawing Sheets

METHOD OF PROTECTING A RADIATION DETECTOR IN A CHARGED PARTICLE INSTRUMENT

This application claims priority from U.S. Provisional Application 61/472,976, filed Apr. 7, 2011, which is hereby incorporated by reference.

The invention relates to a method of protecting a radiation detector in a charged particle beam apparatus, the apparatus comprising a source for producing a beam of charged particles, a condenser system comprising lenses for illuminating a sample, a projection system comprising lenses for forming a magnified image of the sample on a detector system, the detector system comprising a radiation detector, the method comprising:

A step of exposing the detector to radiation using a first set of parameters, the set of parameters including condenser lens settings, projection lens settings, charged particle beam energy and beam current, A step of requiring a change in parameters, Such a method is known from Transmission Electron Microscopy (TEM).

In a TEM an electron gun produces an energetic beam of electrons, with an adjustable energy that is typically between 50 keV and 400 keV. The electron beam is manipulated by condenser lenses and deflection coils to irradiate (illuminate) a sample, said sample held at a sample position. The sample can be positioned by a sample holder, so that an area of interest can be brought into view. A projection system forms an enlarged image of a part of the sample on a detector system. Typical magnification ranges from $10^3$ times to more than $10^6$ times, and typical resolution being as small as 100 pm or less.

The image is typically formed on a detector with a fluorescent screen, in which the fluorescent screen is imaged on a CCD or CMOS chip. However, more and more direct electron detectors (DEDs) are used. Advantages of a DED are, for a given exposure, a better signal-to-noise ratio (SNR). This is advantageous as samples are damaged by the irradiating beam of electrons, and it is thus essential to get an image with as little electrons hitting the sample as possible.

A drawback of DEDs is that they can easily be over-illuminated. Experiments by the inventors showed that in a hardened CMOS chip an exposure to a total dose of $5 \cdot 10^6$ electrons in a 14·14 µm² pixel results in permanent damage, more specifically to an increase in so-named dark current resulting in a decrease of SNR and a decrease of dynamic range that leaves the detector inoperable. This mentioned dose relates to an accumulated dose over the life time of the detector, and therefore even a short exposure to a high current density should be avoided.

For a discussion of a CMOS direct electron detector, its advantages and its failing mechanism see e.g. "Characterisation of a CMOS Active Pixel Sensor for use in the TEAM Microscope", M. Battaglia et al., Nuclear Instruments and Methods in Physics Research Section A, Volume 622, Issue 3, p. 669-677.

As known to the person skilled in the art TEM settings like magnification, condenser settings, etc., are often changed during an observation session of a sample. The prior art method for avoiding damage to the DED when changing microscope settings involves: beam blanking during while changing lens excitations, and retraction of the detector and measuring the current/current density falling on e.g. a fluorescent screen using the new settings (this is known as the screen current). Based on this measurement it is decided to insert the DED again, or to change the microscope settings. This is a quite time consuming process. Therefore often another method is used, based on user expertise, but this may well result in permanent damage to the DED.

There is a need for a fail-safe and quick method for protecting a radiation detector in a charged particle beam apparatus.

The invention intends to provide such a method.

To that end the method of the invention is characterized in that the method comprises A step of predicting the flux density to which the detector will be exposed at the changed parameters before realizing said change in parameters, the prediction based on an optical model and/or a look-up table with one or more input variables from the group of condenser lens settings, projection lens settings, charged particle beam energy, beam current as input, and A step of comparing the predicted flux density with a predetermined value, and, depending on the comparison, either Implement said change of parameters when the predicted flux density is below the predetermined value, or Avoid exposure of the detector to the flux density associated with the requested change in parameters when the predicted flux density is above the predetermined value.

The invention is based on the insight that, when a behavior model of the optics of the charged particle beam apparatus is available [in the form of an optical model or in the form of a Look-Up-Table (LUT)], it can be predicted to what exposure the radiation detector will be exposed. If the predicted exposure is above a predetermined level, the changes are not implemented and/or the beam is kept blanked, so that the detector is not exposed to said high level of radiation. If, however, the predicted exposure is below the predetermined level, it is safe to expose the detector to said radiation, and the changes can be implemented. Preferably the instrument generates an error message or a warning when the predicted flux density is above the predetermined value, and the requested change in parameters is not effectuated.

In a preferred embodiment the radiation detector is a Direct Electron Detector, the radiation comprises electrons and the detected flux density is a current density.

When detecting electrons, the flux density can be expressed as a current density. Also other, non-SI units, such as electrons per µm² per second are used.

The charged particle beam apparatus can be a Transmission Electron Microscope.

As mentioned earlier DEDs are used in TEMs. An example is the Falcon™ detector for use in a Titan™, both manufactured by FEI Company, Hillsboro, USA, applicant of this invention.

Preferably, when a warning or an error message is generated the excitation of the lenses is not changed and//or the beam is kept blanked, as a result of which the detector is not exposed to excessive exposure, resulting in permanent damage to the detector.

Changing the excitation of lenses and or beam energy may result in high exposure of the detector. It is therefore preferred that, during changes, the beam is blanked with a beam blanker (either electrostatic or magnetic, or a combination thereof)

The method proved especially effective for protecting CMOS and CCD chips against over-exposure, said over-exposure resulting in permanent damage to the detector.

To improve the accuracy of the Look-Up Table (LUT) or the optical model, a calibration can be performed.

As will be clear to the person skilled in the art, the better the optical model is, the less calibration is needed. Also, when the observation session is limited to one beam energy, the calibration can be limited to that energy.

The invention is now elucidated using figures, in which corresponding numerals refer to corresponding features.

BRIEF DESCRIPTION OF THE DRAWINGS

To that end:

FIG. 1 schematically shows a Transmission Electron Microscope with a Direct Electron Detector.

FIG. 1 shows an electron source 101 that emits a beam of electrons round optical axis 100. Alignment coils 102 center the beam round the optical axis, and beam limiting aperture 103 limits the beam and the beam current. Condenser lenses 104 manipulate the beam so that a sample 111 at a sample position is illuminated. The position of the sample can be changed by sample manipulator 112, so that only the area of interest is illuminated. The sample is placed in the field of magnetic objective lens 105 as a result of which the objective lens forms an intermediate image of the sample. Said intermediate image, that is already an enlarged image, is further magnified by projection lenses 106 until a magnified image is formed on fluorescent screen 107. The fluorescent screen can be viewed via viewing port 108. The screen is mounted on a hinge 109, enabling the screen to be removed from the path of the beam, so that the magnified image is formed on direct electron detector 151. Electrically screen 107 is via lead 152 connected to a current measuring unit 153, so that the current impinging on the screen can be measured. The TEM further comprises a housing 120, pumping ducts 121 and one or more vacuum pumps 122. The microscope further comprises a controller (not shown) for controlling all signals, and also for acquiring the detector signal and representing this on a monitor (not shown).

Figure 1:
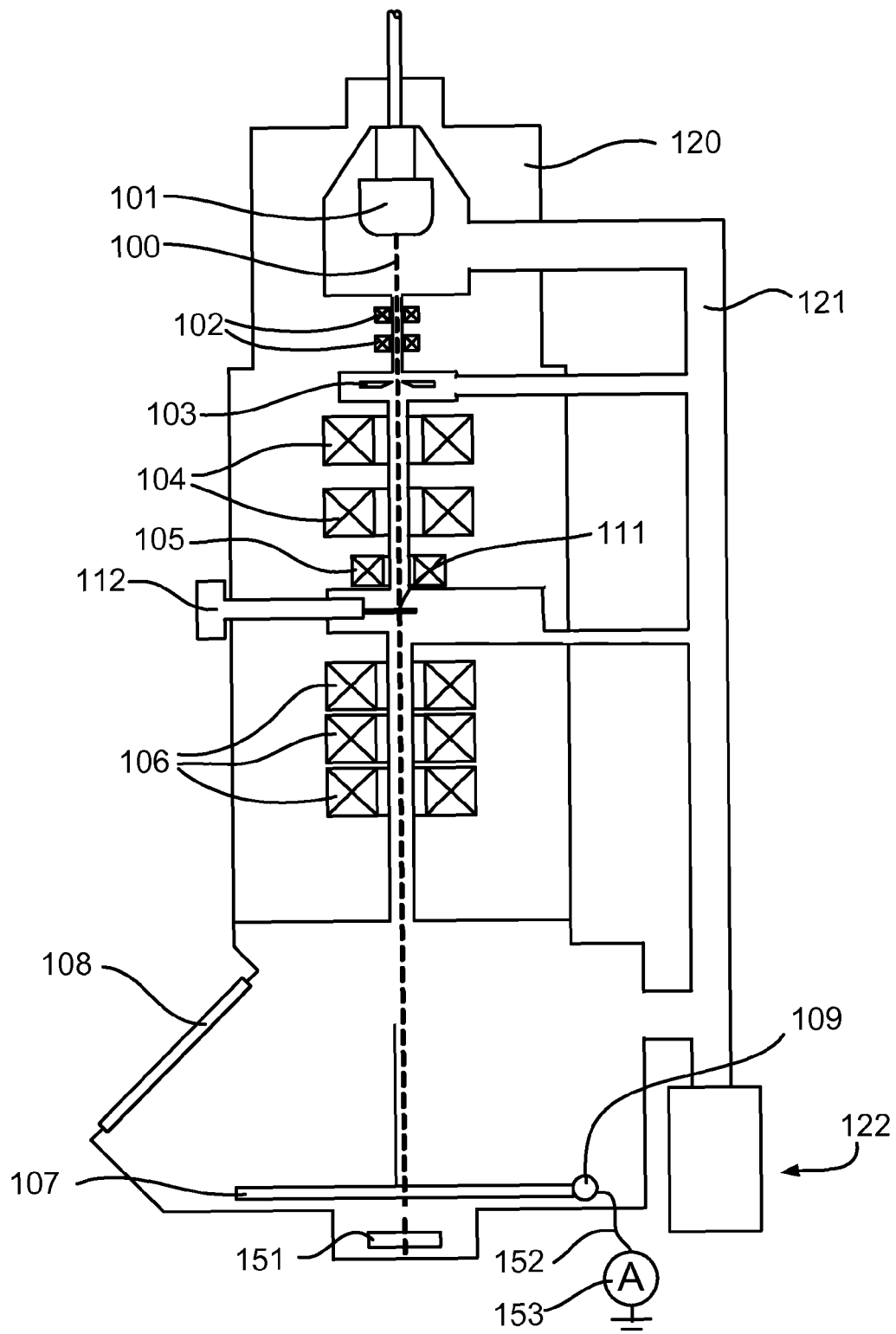
FIG. 1 schematically shows a TEM with a DED.

It is noted that the acquisition and processing can be done by the microscope controller, but may also be done by a separate computer. Said computer may be in communication with the controller, and it is then a matter of semantics whether to define the computer as part of the controller or not.

The microscope further typically comprises a beam blanker (not shown), typically a magnetic deflector positioned between electron source and sample position, to blank the beam.

The one or more vacuum pumps typically evacuate the TEM to a vacuum of between $10^{-4}$ mbar (at the detector area) to $10^{-10}$ mbar (at the electron source area. As known to the skilled person the type of vacuum pump can be found in the group of ion getter pumps, turbo-molecular pumps, oil diffusion pumps, etc, if necessary extended with pre-vacuum pumps.

The sample in a TEM is an extremely thin sample, typically between 25 nm and 1 µm. Such a thin sample is at least partly transparent to the electrons impinging on it, the electrons having an adjustable energy of typically between 50 keV and 400 keV. As a result of that a part of the electrons are transmitted through the sample, albeit that they may interact with the sample and are, for example, scattered or lose energy. An image can be made using the transmitted electrons, the image showing absorption contrast (parts of the sample intercepts more electrons than other parts), or phase contrast (by the interference of non-scattered electrons and scattered electrons) or show energy loss.

It is noted that also other types of information can be derived, such as crystallographic information by imaging the diffraction pattern.

As the sample is easily damaged by the irradiation with energetic electrons, the exposure to said electrons should be kept to a minimum. This demands detectors with a high SNR, also expressed as a high DQE (Detected Quantum Efficiency). DEDs are introduced to answer that demand, but as mentioned earlier, a problem is that DEDs are damaged by the impinging electrons and the detector reaches end-of-life after detecting a certain amount of electrons per µm² (the exact amount depending on detector design and electron energy).

In the prior art the current in a spot (representing an area on the screen) is measured with amp-meter 153 and using that measurement the user must make a decision whether to expose the detector to the electrons.

The invention proposes to proactively estimate the current on the detector 151 by predicting this using a LUT or an optical model of the microscope, more specifically an optical model comprising the aperture 103, condenser lenses 104, and projection lenses 106, as well as the voltage of electron source 101.

It is noted that this figure only shows a schematic drawing, and that a TEM comprises many more alignment coils, apertures, etc., and that also more detectors may be used, such as X-ray detectors. Also the DED may take the form of, for example, a silicon die that is inserted to the beam path. All these variants are obvious to the person skilled in the art.

Figure 2:
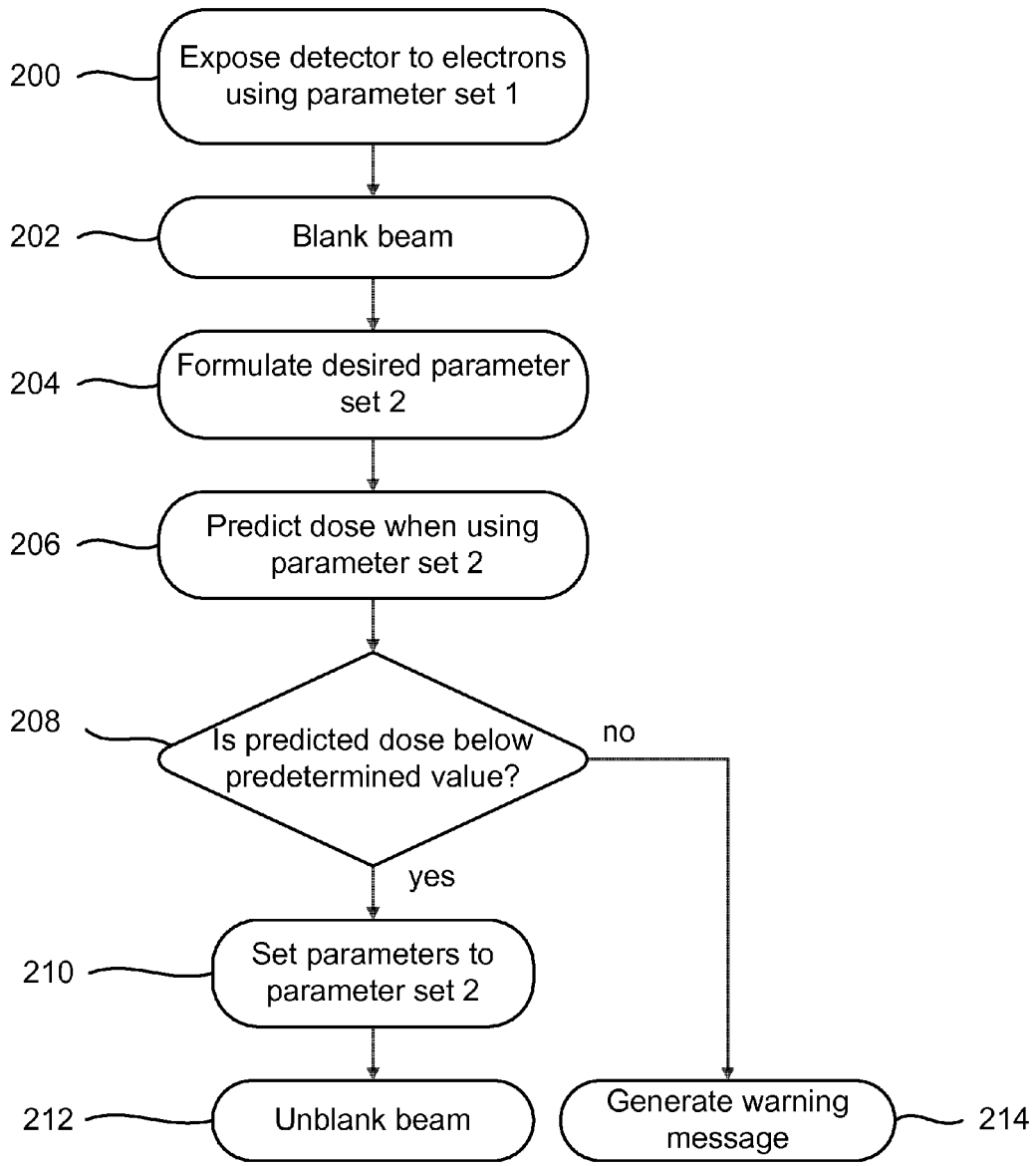
FIG. 2 schematically shows a flow-diagram for the method according to the invention.

FIG. 2 schematically shows a flow-diagram for the method according to the invention.

Step 200 shows that a TEM using a first set of parameters is provided.

Step 202 shows that the beam is blanked, to avoid unnecessary illumination of the detector.

Step 204 shows that a request or instruction is given to the controller of the microscope to set the parameters to another set of values.

Step 206 shows that the dose resulting from the requested parameter set is predicted.

Step 208 shows that this predicted value is compared to a predetermined value.

Step 210 shows that, when the predicted value is less than the predetermined value, the parameters are set to the requested values.

Step 212 shows that the beam is unblanked, so that the detector is exposed to a value that should be in close approximation to the predicted value determined in step 206.

Step 214 shows that, when the predicted value exceeds the predetermined value, a warning is generate preferably on a User Interface (UI)

Steps 200, 202, 204, 210 and 212 are part of the prior art: the user of the TEM operates the microscope at a first set of parameters (sample current and sample current density, magnification, beam energy) and wants to change the parameter set, for example because during the observation session of the sample an image at a different magnification needs to be made. The beam is blanked, the microscope controller is instructed to change the relevant parameters, and the beam is unblanked again.

At the moment that the beam is unblanked, the detector can be exposed to a high dose, thus using up its life time dose limit.

To avoid this undesired exposure the invention proposes to predict the dose that will be falling on the detector before changing the parameters. Such a prediction is preferably made using a LUT (Look-Up-Table) or an optical model where the effect of the set of parameters can be estimated. The LUT can require interpolation, and can have as many dimensions as needed. Also an optical model, in which the behavior of the parameters is expressed in formulae, can be used. Even a mixture of a LUT and an optical model can be used. It is mentioned that the accuracy of a LUT and an optical model is improved by calibration, that is: by determining what dose and/or dose dependency occurs at a given set of settings.

It is noted that blanking the beam in step 202 is here depicted prior to formulating the desired parameter set in step 204, but that it is not necessary to do it in this order. It is even possible to perform the method with blanking/unblanking the beam, but a problem may occur in that during the changing of parameters intermediate situations occur in which the illumination of sample and/or detector exceeds maximum levels.

After generating the warning and/or error message in step 214, changes to the parameter set are preferably postponed and the (controller of the) microscope waits for instructions of the user, after which the whole process is typically repeated from step 204 onwards.

It is noted that it is envisaged that the user is capable of overriding the warning or error message, thus taking the risk of overexposure and possible damage of the detector.

It is noted that step 214 can be implemented as a 'no action' (not generating an actual warning or error message), and for example an explanatory part in the user manual of said instrument. However, a warning or error message is preferred. The warning or error message may take the form of an audible warning, a text message on a control screen, a visible warning in the form of a blinking light or a colored LED, or the like.

It is further noted that avoiding exposure of the detector may involve blanking of the beam with e.g. a magnetic blanker, an electrostatic blanker, or a mechanical shutter, but may also involve retraction of the detector to a position where it is not exposed to the damaging radiation, and observe the image with another detector that is less prone to damage stemming from irradiation, such as a fluorescent screen.

We claim as follows:

1. Method of protecting a radiation detector in a charged particle beam apparatus, the apparatus including a source for producing a beam of charged particles, a condenser system including lenses for illuminating a sample, a projection system including lenses for forming a magnified image of the sample on a detector system, the detector system including a radiation detector, the method comprising:
    exposing the detector to radiation using a first set of parameters, the set of parameters including condenser lens settings, projection lens settings, charged particle beam energy and beam current,
    predicting the flux density to which the detector will be exposed at a changed parameters before implementing said change in parameters, the prediction based on an optical model and/or a look-up table with one or more input variables from the group of condenser lens settings, projection lens settings, charged particle beam energy, beam current as input, and
    comparing the predicted flux density with a predetermined value, and, depending on the comparison, either
    Implement said change of parameters when the predicted flux density is below the predetermined value, or
    Avoid exposure of the detector to the flux density associated with the requested change in parameters when the predicted flux density is above the predetermined value.

2. The method of claim 1 in which comparing the predicted flux density with a predetermined value includes generating a warning or an error message when the predicted flux density exceeds said predetermined value.

3. The method of claim 1 in which the detector is a direct electron detector, the radiation comprises electrons and the flux density is a current density.

4. The method of claim 3 in which the detector is equipped to detect electrons transmitted through a sample.

5. The method of claim 2 in which, when an error message or a warning is generated, the excitation of the lenses and the beam energy are not changed.

6. The method of claim 2 in which, when an error message or a warning is generated, the beam is blanked by a beam blanker.

7. The method of claim 1 in which the beam is blanked by a beam blanker when changing the parameters.

8. The method of claim 1 in which exposure of the detector to a dose exceeding the predetermined value results in permanent damage to the detector.

9. The method of claim 1 in which the detector is equipped with a CMOS chip or a CCD chip for direct detection of electrons.

10. The method of claim 1, the method further comprising, prior to exposing the detector to radiation using a first set of parameters, calibrating the optical model and/or Look-Up Table by measuring the beam current for different sets of parameters.

11. Software carrier carrying program code for programming a charged particle beam apparatus comprising a programmable controller to perform the method of claim 1.

12. A method of protecting a radiation detector in a charged particle beam apparatus, comprising:
    exposing the detector to radiation using a first set of parameters, the set of parameters including condenser lens settings, projection lens settings, charged particle beam energy and beam current,
    predicting the flux density to which the detector will be exposed at a changed parameters before implementing said change in parameters, the prediction based on an optical model and/or a look-up table with one or more input variables from the group of condenser lens settings, projection lens settings, charged particle beam energy, beam current as input, and
    comparing the predicted flux density with a predetermined value,
        when the predicted flux density is below the predetermined value, implementing said change of parameters, and
        when the predicted flux density is above the predetermined value, avoiding exposure of the detector to the flux density associated with the requested change in parameters.

13. The method of claim 12 in which avoiding exposure of the detector to the flux density associated with the requested change in parameters includes blanking the beam.

14. The method of claim 12 further comprising generating a warning or an error message when the predicted flux density exceeds said predetermined value.

15. The method of claim 12 in which the detector is equipped with a CMOS chip or a CCD chip for direct detection of electrons.

16. The method of claim 12 in which the detector is equipped to detect electrons transmitted through a sample.

17. The method of claim 12 in which the detector is a direct electron detector, the radiation comprises electrons and the flux density is a current density.

\* \* \* \* \*